United States Patent
Park et al.

(10) Patent No.: US 7,030,476 B2
(45) Date of Patent: Apr. 18, 2006

(54) RECTIFIER DIODE DEVICE

(75) Inventors: Jung Eon Park, Gyeongsangbuk-Do (KR); Lee Dong Kim, Gyeongsangbuk-Do (KR)

(73) Assignee: KEC Corporation, (KR)

( * ) Notice: Subject to any disclaimer, the term of this patent is extended or adjusted under 35 U.S.C. 154(b) by 0 days.

(21) Appl. No.: 10/932,401

(22) Filed: Sep. 2, 2004

(65) Prior Publication Data
US 2005/0082692 A1   Apr. 21, 2005

(30) Foreign Application Priority Data
Oct. 20, 2003   (KR)   ............ 10-2003-0072931

(51) Int. Cl.
*H01L 23/02* (2006.01)
*H01L 23/22* (2006.01)
*H01L 23/24* (2006.01)

(52) U.S. Cl. .......... 257/678; 257/687; 257/688; 257/689; 257/690; 257/658

(58) Field of Classification Search ........... 257/658, 257/678, 687, 688, 689, 690
See application file for complete search history.

(56) References Cited

U.S. PATENT DOCUMENTS 5,760,425 A * 6/1998 Kobayashi et al. ......... 257/181
5,886,403 A * 3/1999 Yoshinaga et al. ......... 257/688
6,160,309 A * 12/2000 Le ........................... 257/684
6,476,480 B1 * 11/2002 Staab et al. ................ 257/693
6,667,545 B1 * 12/2003 Spitz ......................... 257/688

FOREIGN PATENT DOCUMENTS

JP   5-191956   * 7/1993   ............ 310/51

* cited by examiner

Primary Examiner—Jasmine Clark
(74) Attorney, Agent, or Firm—St. Onge Steward Johnston & Reens LLC

(57) ABSTRACT

Disclosed is a rectifier diode device. The rectifier diode device includes a conductive base, a semiconductor chip, a conductive lead and insulation resin. A trench and a post are formed in the conductive base in order to increase a bonding surface between the conductive base and the insulating resin and to lengthen a humidity transfer path for the semiconductor chip. Due to the trench and the post, the bonding surface between the conductive base and the insulating resin increases and the humidity transfer path for the semiconductor chip lengthens, thereby improving heat emission performance of the rectifier diode device. A plurality of prismatic protrusions is formed at an outer peripheral wall of the conductive wire so that coupling force between the conductive wire and an external device is improved. A protrusion ring is provided at a lower surface of the conductive wire so that stress applied to the semiconductor chip is minimized when the rectifier diode device is press-fitted into the external device.

21 Claims, 9 Drawing Sheets

RECTIFIER DIODE DEVICE

This application claims priority of pending Korean Patent Application No. 2003-72931 filed Oct. 20, 2003.

BACKGROUND OF THE INVENTION

1. Field of the Invention

The present invention relates to a rectifier diode device, and more particularly to a rectifier diode device capable of reinforcing adhesive force between a conductive base and insulation resin, improving a humidity resistance characteristic by lengthening a humidity transfer path for a semiconductor chip, preventing the semiconductor chip from being broken while improving mechanical coupling force with respect to an external device by distributing mechanical stress when it is assembled with the external device, and improving heat emission performance.

2. Description of the Related Art

Generally, a rectifier diode device includes a conductive base, a semiconductor chip bonded on the conductive base by means of a conductive material in order to perform a rectifying function, a conductive lead bonded on the semiconductor chip by means of a conductive material, and insulating resin for encapsulating the conductive base, the semiconductor chip and the conductive lead.

In such a rectifier diode device, the conductive base is mechanically press-fitted into an external device so that a semiconductor device is mechanically and electrically coupled with the external device. For instance, the rectifier diode device is coupled to a heat sink installed in an alternator of a vehicle. In addition, the conductive lead is electrically connected to a terminal lead of the alternator by means of a connection member in use.

However, the conventional rectifier diode device represents a problem that the conductive base is easily separated from the insulation layer under a high temperature condition because coupling force between the conductive base and insulating resin of the conventional rectifier diode device is weak.

In addition, according to the conventional rectifier diode device, humidity is easily transferred to the semiconductor chip along an interfacial surface between the conductive base and insulation resin. That is, the convention rectifier device has a short humidity transfer path, so the semiconductor chip may be damaged or malfunctioned due to humidity.

In a case in which a plastic case is coupled to an outer portion of the insulation resin, humidity is easily transferred to the semiconductor chip by passing through the plastic case. In this case, additional equipment and process are necessary to attach the plastic case to the insulation resin, thereby increasing a manufacturing cost for the rectifier diode device.

In addition, when the conductive base of the conventional rectifier diode device is mechanically press-fitted into the external device, stress is directly transferred to the semiconductor chip so that the semiconductor chip can be easily broken.

Furthermore, since the conventional rectifier diode device is press-fitted into a coupling hole of the external device, the coupling hole of the external device may be worn so that the conventional rectifier diode device can be easily separated from the external device.

In addition, the conventional rectifier diode device represents inferior heat emission performance, so electrical performance of the semiconductor chip may become lowered due to heat generated therefrom or applied thereto from the external device.

BRIEF SUMMARY OF THE INVENTION

Accordingly, the present invention has been made to solve the above-mentioned problems occurring in the prior art, and an object of the present invention is to provide a rectifier diode device capable of reinforcing adhesive force between a conductive base and insulation resin.

Another object of the present invention is to provide a rectifier diode device capable of improving a humidity resistance characteristic thereof by lengthening a humidity transfer path extending from an interfacial surface between a conductive base and insulating resin to a semiconductor chip.

Still another object of the present invention is to provide a rectifier diode device capable of preventing a semiconductor chip from being broken by distributing mechanical stress when the rectifier diode is coupled to an external device.

Still another object of the present invention is to provide a rectifier diode device capable of improving coupling force between the rectifier diode device and an external device by compensating for wear of a coupling hole of the external device when the rectifier diode device is press-fitted into the coupling hole of the external device.

Still another object of the present invention is to provide a rectifier diode device capable of preventing electrical performance of a semiconductor chip from being lowered by improving heat emission performance of the rectifier diode device.

To accomplish the above objects, there is provided a rectifier diode device comprising: a conductive base including a first surface having a substantially planar structure, a trench having a predetermined depth and a predetermined width and formed below an outer peripheral portion of the first surface, a post formed at an outer peripheral portion of the trench and having a predetermined height, a second surface formed at an outer peripheral portion of the post in vertical to the first surface, and a third surface formed at a lower portion of the second surface in opposition to the first surface; a semiconductor chip connected to the first surface of the conductive base through a first connection member; a conductive lead connected to an upper surface of the semiconductor chip through a second connection member; and insulating resin for encapsulating the first surface of the conductive base formed between an outer portion of the semiconductor chip and an inner portion of the post, the trench, the semiconductor chip and the conductive lead while exposing an upper end of the conductive lead and the second and third surfaces of the conductive base to an exterior.

To accomplish the above objects, according to another embodiment of the present invention, there is provided a rectifier diode device comprising: a conductive base including a first surface having a substantially planar structure, a second surface formed at a lower portion of an outer peripheral portion of the first surface in parallel to the first surface, a trench formed in the second surface with a predetermined depth, a third surface formed at a lower portion of an outer peripheral portion of the second surface in vertical to the second surface, and a fourth surface formed at a lower portion of the third surface in opposition to the first and second surfaces; a semiconductor chip connected to the first surface of the conductive base through a first connection member; a conductive lead connected to an upper surface of the semiconductor chip through a second connection member; and insulating resin for encapsulating the first surface, the second surface, and the trench of the conductive base, which are aligned corresponding to an outer peripheral portion of the semiconductor chip, the semiconductor chip and the conductive lead while exposing an upper end of the conductive lead and the third and fourth surfaces of the conductive base to an exterior.

The present invention will be more apparent from the following detailed description taken in conjunction with the accompanying drawings.

BRIEF DESCRIPTION OF DRAWINGS

Common reference numerals are used throughout the drawings and the detailed description to indicate the same elements.

DETAILED DESCRIPTION OF INVENTION

Figure 1A:
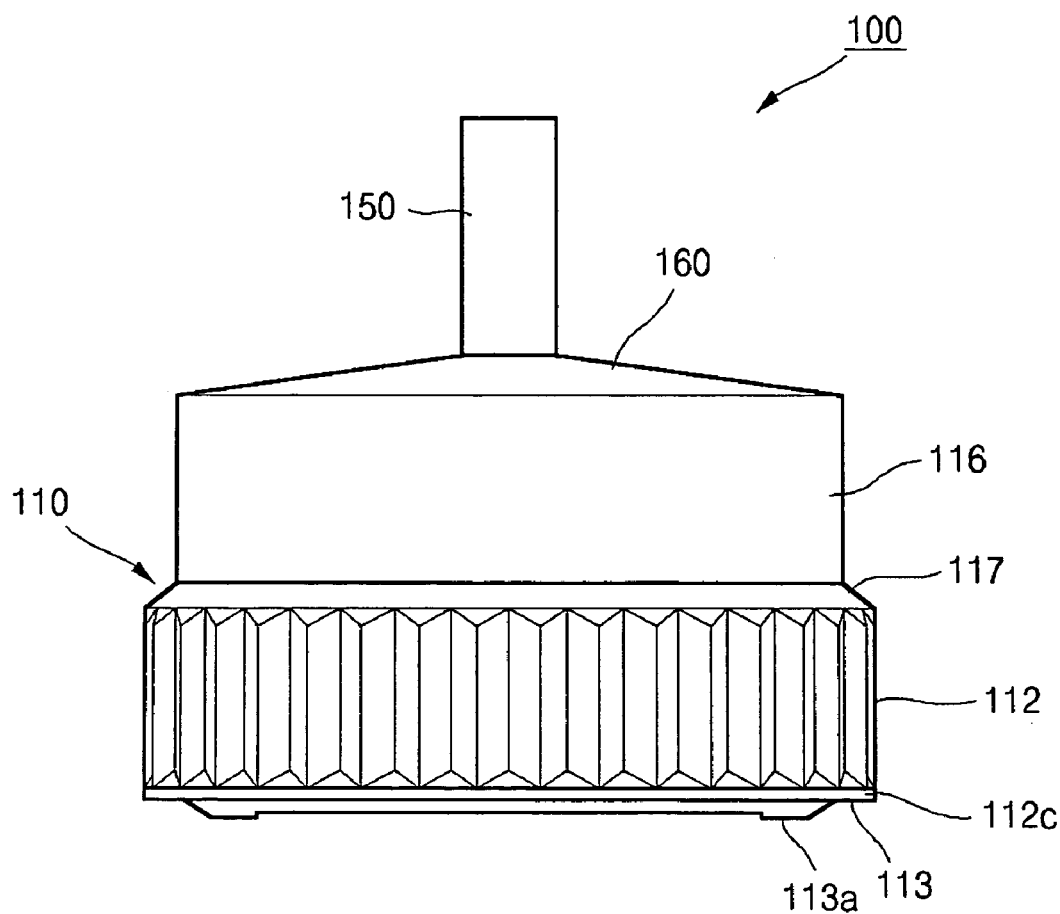
FIG. 1A is a front view showing a rectifier diode device according to one embodiment of the present invention.
Figure 1B:
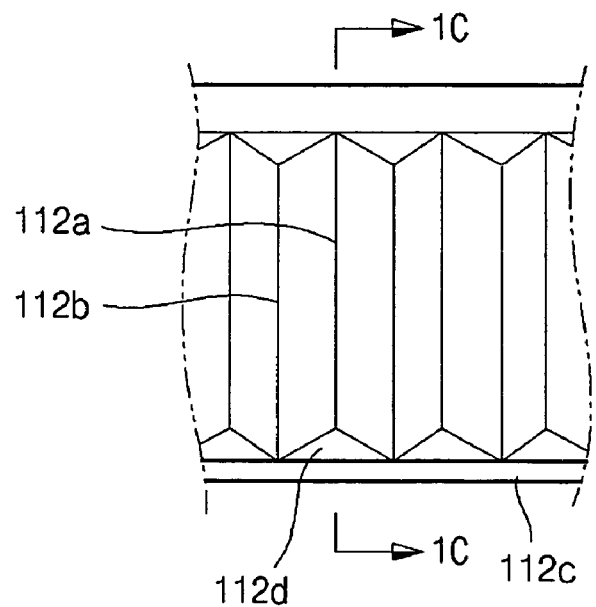
FIG. 1B is an enlarged view of a part of an outer peripheral portion of a conductive base shown in FIG. 1A.
Figure 1C:
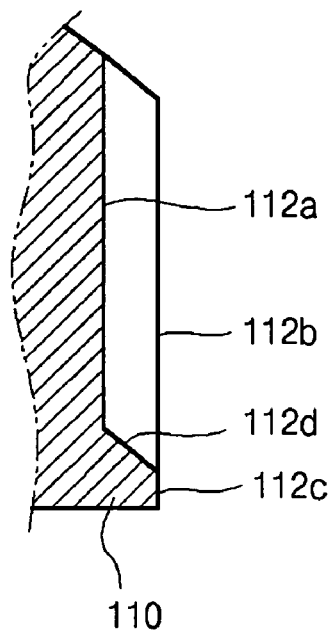
FIG. 1C is a sectional view taken along line 1C—1C of FIG. 1B.
Figure 2:
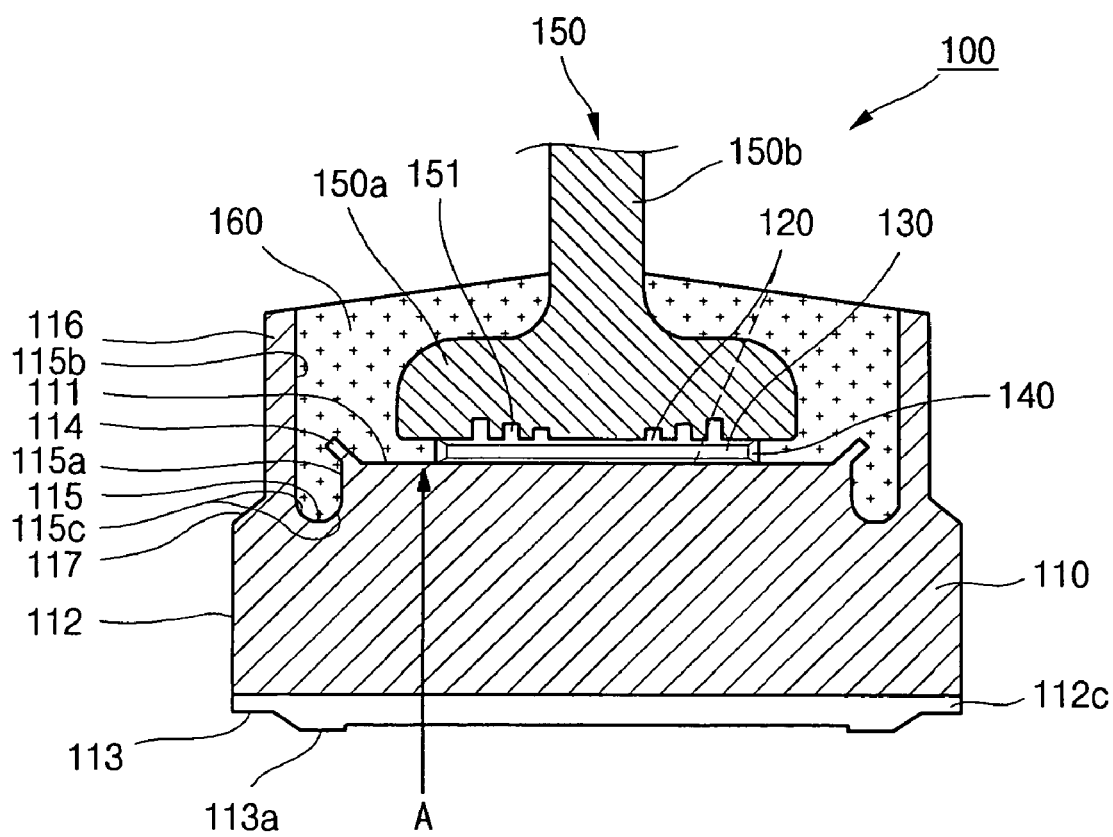
FIG. 2 is a sectional view of FIG. 1A.

FIG. 1A is a front view showing a rectifier diode device according to one embodiment of the present invention, FIG. 1B is an enlarged view of a part of an outer peripheral portion of a conductive base shown in FIG. 1A, FIG. 1C is a sectional view taken along line 1C—1C of FIG. 1B. In addition, FIG. 2 is a sectional view of FIG. 1A.

As shown in FIGS. 1A to 1c and 2, a rectifier diode device 100 of the present invention includes a conductive base 110 press-fitted into an external device, a semiconductor chip 130 connected to an upper portion of the conductive base 110 by means of a connection member 120, a conductive lead 150 connected to an upper portion of the semiconductor chip 130 by means of another connection member 120 so as to be coupled to the external device, and insulating resin 160 for encapsulating predetermined parts of the conductive base 110, the semiconductor chip 130 and the conductive lead 150.

The conductive base 110 is formed with a first surface 111 having a substantially flat-shape so as to allow the semiconductor chip 130 to be connected to the conductive base 110. Protrusions 114 having a predetermined length are outwardly protruded from an upper peripheral portion of the first surface 111 of the conductive base 110 at an angle of 30 to 500 in order to improve coupling force between the conductive base 110 and the insulating resin 160. In addition, a trench 115 having predetermined depth and width is formed below the first surface 111 and the protrusions 114 in order to lengthen a humidity transfer path for the semiconductor chip 130 while improving coupling force between the conductive base 110 and the insulating resin 160. A post 116 is formed at an outer peripheral portion of the trench 115, and extends upward by a predetermined length in order to lengthen the humidity transfer path for the semiconductor chip 130 while improving coupling force between the conductive base 110 and the insulating resin 160. A second surface 112 of the conductive base 110 is formed at a lower portion of the post 116. The second surface 112 is aligned perpendicularly to the first surface 111 of the conductive base 110. The second surface 112 is an area press-fitted into a coupling hole (not shown) of the external device. In addition, a third surface 113 of the conductive base 110 is formed at a lower portion of the second surface 112 of the conductive base 110 in opposition to the first surface 111. The third surface 113 is an area to which pressure is applied in order to couple the rectifier diode device 100 into the coupling hole of the external device. In addition, a fitting surface 117 is further formed between the post 116 and the second surface 112. The fitting surface 117 is downwardly inclined in an outward direction. The fitting surface 117 is an area firstly press-fitted into the external device and a lower end of the fitting surface 117 is aligned in the same line as a bottom surface of the trench 115. Thus, when the rectifier diode device 100 is press-fitted into the external device, the trench 115 may absorb and damp stress applied to the fitting surface 117.

The trench 115 includes a first wall section 115a formed at an outer peripheral portion of the first surface 111 of the conductive base 110, a second wall section 115b formed at an inner peripheral portion of the post 116 and a round section 115c formed between lower portions of the first and second wall sections 115a and 115b. Accordingly, stress generated when the conductive base 110 is press-fitted into the external device, that is, stress generated when the fitting surface 117 of the conductive base 110 is press-fitted into the external device can be effectively distributed and absorbed by means of the round section 115c, thereby preventing the semiconductor chip 130 from being broken.

In addition, a plurality of prismatic protrusions including valley sections 112a and mountain sections 112b are formed on the second surface 112 of the conductive base 110 in order to allow the rectifier diode device 100 to be easily inserted into the coupling hole of the external device. That is, an outer diameter of-the prismatic protrusions defined by the mountain sections 112b is larger than a diameter of the coupling hole formed in the external device (for example, a heat sink of an alternator) and an inner diameter of the prismatic protrusions defined by the valley sections 112a is identical to or smaller than the diameter of the coupling hole formed in the external device, so that the mountain sections 112b of the prismatic protrusions are worn while making contact with a wall section of the coupling hole, thereby allowing the rectifier diode device 100 to be easily inserted into the coupling hole of the external device. Particles separated from the mountain sections 112b of the prismatic protrusions are positioned in the valley sections 112a of the prismatic protrusions, allowing the conductive base 110 to be securely coupled with the coupling hole of the external device. In addition, a circumferential surface 112c having a diameter corresponding to the outer diameter of the prismatic protrusions is further formed at a lower end of the second surface 112, and an inclined surface 112d having a substantially triangular shape is formed between the valley sections 112a and the circumferential surface 112c. When the rectifier diode device 100 is press-fitted into the coupling hole of the external device, the coupling hole is also worn due to friction between the mountain sections 112b of the prismatic protrusions and the wall section of the coupling hole so that the diameter of the coupling hole becomes enlarged. The inclined surface 112d compensates for wear of the coupling hole so that the rectifier diode device 100 cannot be easily separated from the external device even if external force is applied thereto.

In addition, the third surface 113 of the conductive base 110 is formed with a protrusion ring 113a protruding from the third surface 113 of the conductive base 110 by a predetermined thickness. The protrusion ring 113a is provided for reducing stress transferred to the semiconductor chip 130 when the rectifier-diode device 100 is press-fitted into the coupling hole of the external device.

A height of the post 116 is larger than a width of the trench 115. In detail, the height of the post 116 is larger than the width of the trench 115 by 3.0 to 3.4 times. In more detail, the height of the post 116 is about 3.8±0.2 mm, and the width of the trench 115 is about 1.178±0.05 mm. In this case, stress applied to the semiconductor chip 130 can be minimized when the rectifier diode device 100 is press-fitted into the coupling hole of the external device.

The semiconductor chip 130 is connected to the first surface 111 of the conductive base 110 by means of a solder or the conductive connection member 120, so that the semiconductor chip 130 can receive an electric signal applied to the conductive base 110. In addition, an insulation protective film 140 is coated at a side of the semiconductor chip 130 in order to prevent current-leakage of the semiconductor chip 130.

The conductive lead 150 is connected to an upper surface of the semiconductor chip 130 by means of the conductive connection member 120 so that the conductive lead 150 can transmit an electric signal from the semiconductor chip 130 to the external device. The conductive connection member 120 may include the solder or the like. The present invention does not limit materials for the conductive connection member 120.

In addition, the insulating resin 160 encapsulates the conductive lead 150, the semiconductor chip 130 and the conductive base 110 while exposing an upper end of the conductive lead 150 and the second and third surfaces 112 and 113 of the conductive base 110 to an exterior. In addition, the insulating resin 160 surrounds the protrusions 114 while being filled in the trench 115 and the second wall section 115b of the post 116 so that coupling force between the insulating resin 160 and the conductive base 110 will be more reinforced.

Herein, a process for encapsulating the conductive lead 150, the semiconductor chip 130 and the conductive base 110 by using the insulating resin 160 can be performed by means of a dispenser (not shown). That is, after dispensing melted insulating resin to an inner portion of the post 116 of the conductive base 110 connected with the semiconductor chip 130 and the conductive lead 150 by means of the dispenser, the melted insulating resin is cured in such a manner that the melted insulating resin may surround the conductive lead 150, the semiconductor chip 130 and the conductive base 110.

After fabricating the rectifier diode device 100 through the above process, the second surface 112 of the conductive base 110 is press-fitted into the external device and the conductive lead 150 is electrically connected to a terminal lead of the external device through soldering or welding.

Figure 3A:
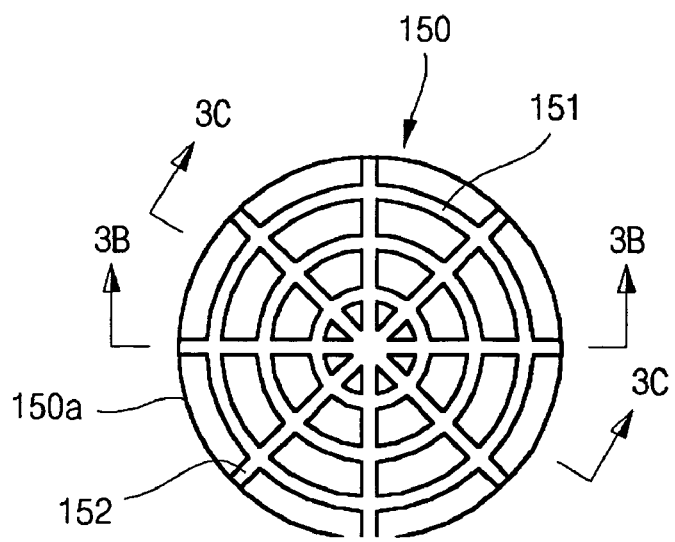
FIG. 3A is a bottom view showing a conductive lead of a rectifier diode device according to one embodiment of the present invention.
Figure 3B:
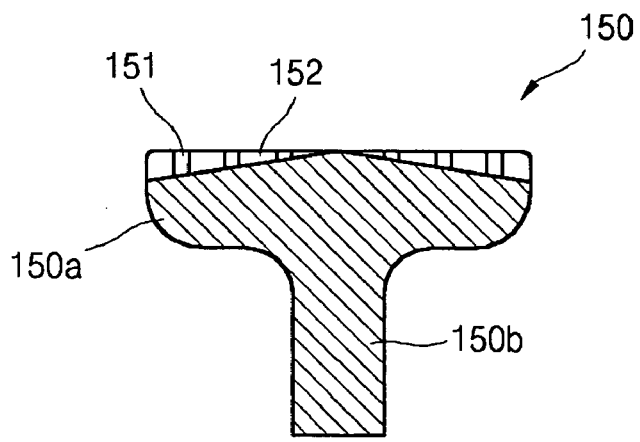
FIG. 3B is a sectional view taken along line 3B—3B of FIG. 3A.
Figure 3C:
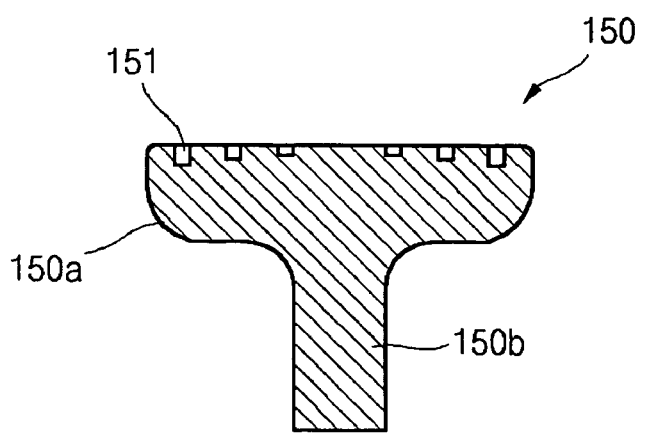
FIG. 3C is a sectional view taken along line 3C—3C of FIG. 3A.

FIG. 3A is a bottom view showing the conductive lead of the rectifier diode device according to one embodiment of the present invention, FIG. 3B is a sectional view taken along line 3B—3B of FIG. 3A, and FIG. 3C is a sectional view taken along line 3C—3C of FIG. 3A.

As shown in FIGS. 3A to 3C, the conductive lead 150 includes a bonding surface 150a connected to the semiconductor chip 130 by means of the connection member 120 and a connection lead 150b electrically connected to the external device. The bonding surface 150a is formed with at least one first slot. First slots 151 are concentrically aligned about a center of the bonding surface 150a with different diameters. In addition, a plurality of second slots 152 are formed radially outward about the center of the bonding surface 150a. The depth of the first and second slots may gradually increase from the center to an outer peripheral portion of the bonding surface 150a. Thus, air is rarely trapped in the connection member 120 interposed between the conductive lead and the semiconductor chip 130. That is, air is rarely trapped in the solder, so a crack phenomenon occurring in the semiconductor chip 130 due to air expansion caused by a high temperature can be prevented.

Figure 4A:
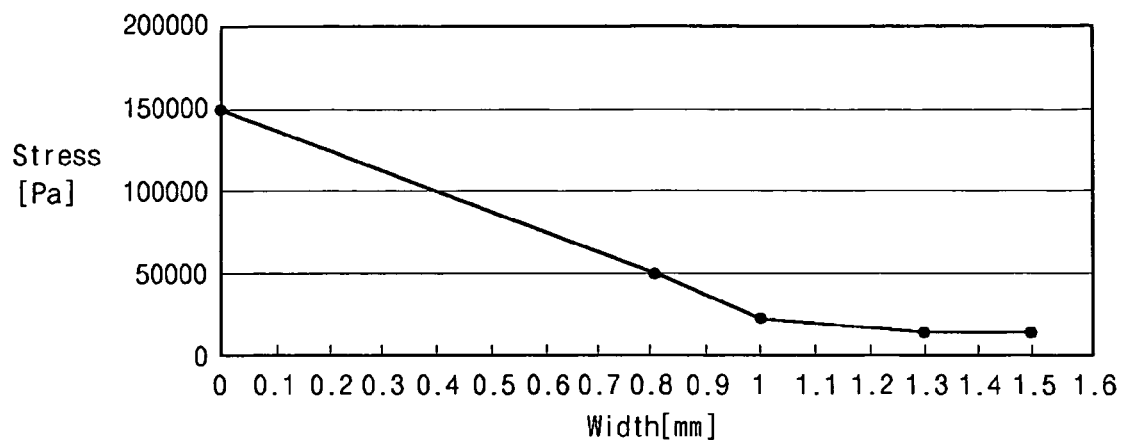
FIG. 4A is a graph showing a relationship between a trench width and stress.
Figure 4B:
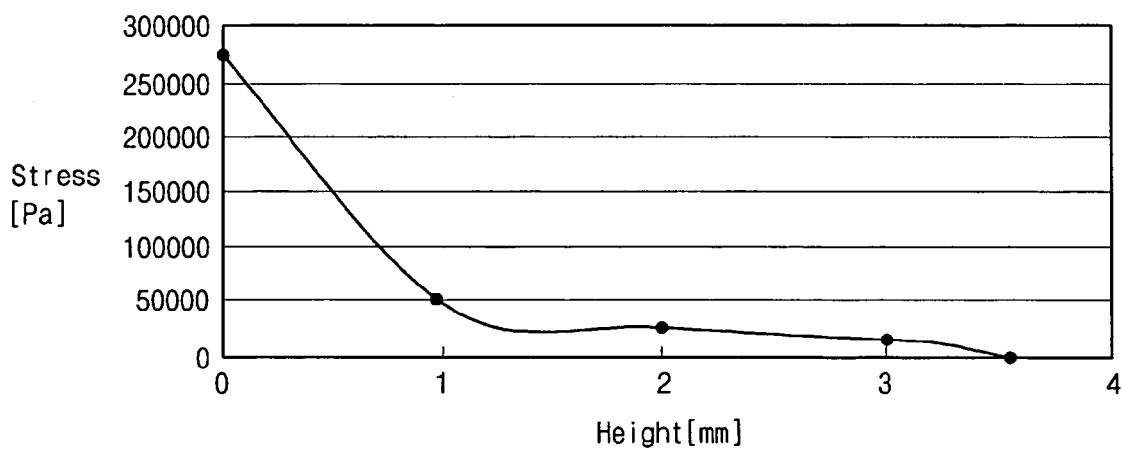
FIG. 4B is a graph showing a relationship between a height of a post and stress.

FIG. 4A is a graph showing a relationship between a trench width and stress, and FIG. 4B is a graph showing a relationship between a height of the post and stress. Herein, a stress analysis point is an "A" area shown in FIG. 2. Thus, graphs shown in FIGS. 4A and 4B will be explained with reference to FIG. 2.

If a width of the trench 115 is identical to or less than 1.178 mm, for example, 0 to 0.8 mm, the semiconductor chip 130 is subject to stress of about 150,000 to 50,000 [Pa] when the rectifier diode device 100 is press-fitted into the external device (see, FIG. 4A). Thus, the semiconductor chip 130 can be easily broken. In addition, if a width of the trench 115 is in a range of 0.8 to 1.178 mm, the semiconductor chip 130 is subject to stress of about 50,000 to 10,000 [Pa], so the stress transferred to the semiconductor chip 130 is significantly reduced. In the meantime, if the width of the trench 115 exceeds 1.178 mm, the stress applied to the semiconductor chip 130 can be further reduced and coupling force between the semiconductor chip 130 and the insulating resin 160 can be more improved while lengthening a humidity transfer path for the semiconductor chip 130. However, this case is disadvantageous because an area for mounting the semiconductor chip 130 becomes reduced, thereby lowering workability.

If the height of the post 116 is identical to or less than 3.8 mm, for example, 0 to 1 mm, the semiconductor chip 130 is subject to stress of about 250,000 to 50,000 [Pa] when the rectifier diode device 100 is press-fitted into the external device (see, FIG. 4B). Thus, the semiconductor chip 130 can be easily broken. In addition, if the height of the post 116 is in a range of 1 to 3.8 mm, the semiconductor chip 130 is subject to stress of about 50,000 to 5,000 [Pa], so the stress transferred to the semiconductor chip 130 is significantly reduced. In the meantime, if the height of the post 116 exceeds 3.8 mm, the stress applied to the semiconductor chip 130 can be further reduced and coupling force between the semiconductor chip 130 and the insulating resin 160 can be more improved while lengthening the humidity transfer path for the semiconductor chip 130. However, this case is disadvantageous because weight of the rectifier diode device 100 may increase and assembling work for the semiconductor chip 130 and the conductive lead 150 may be deteriorated.

Therefore, the stress transferred to the semiconductor chip 130 and workability can be controlled by adjusting the width of the trench 115 and the height of the post 116. In addition, it is also possible to enlarge a contact area between the conductive base 110 including the trench 115 and the post 116 and the insulating resin 160, so that coupling force between the conductive base 110 and the insulating resin 160 can be improved. As a result, the insulating resin 160 is prevented from being easily separated from the conductive base 110. Since a bonding surface, that is, an interfacial surface between the conductive base 110 and the insulating resin 160 becomes enlarged, the humidity transfer path for the semiconductor chip 130 may lengthen, so the degradation of electrical characteristics of the semiconductor chip 130 or breakage of the semiconductor chip 130 can be prevented. In addition, an entire surface area of the conductive base 110 may increase due to the post 115, heat generated from the semiconductor chip 130 or applied from the external device can be effectively emitted out of the rectifier diode device 100. That is, heat emission performance of the rectifier diode device 100 can be improved.

Figure 5A:
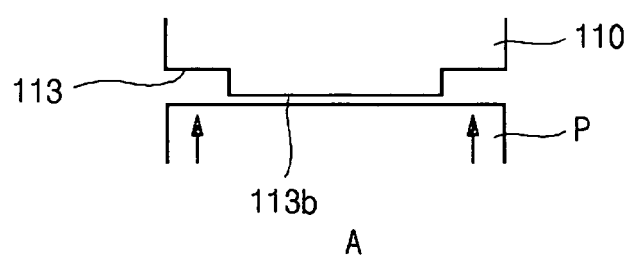
FIGS. 5A to 5C are partially sectional views for explaining pressure action according to a shape of a lower portion of a conductive base.
Figure 5B:
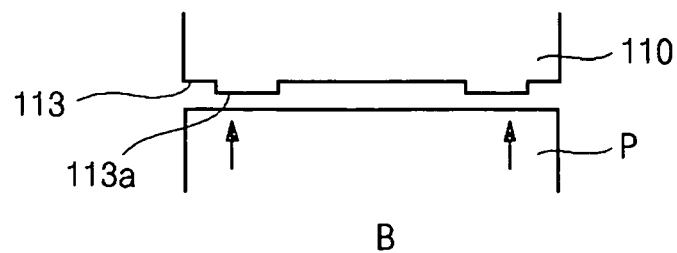
Figure 5C:
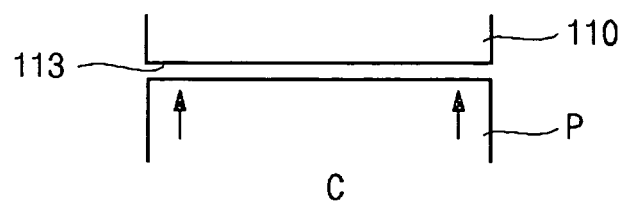
Figure 5D:
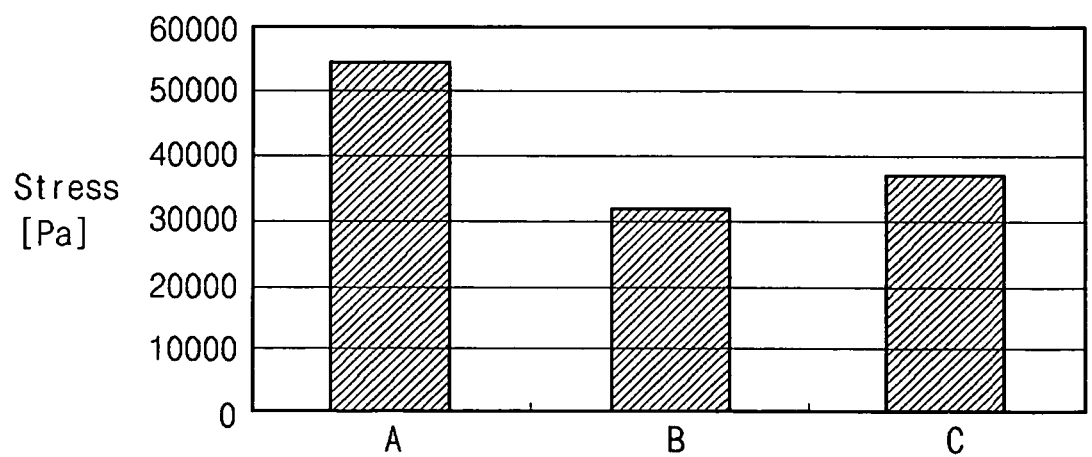
FIG. 5D is a graph showing a relationship between a shape of a lower portion of a conductive base and stress.

FIGS. 5A to 5C are partially sectional views for explaining pressure action according to a shape of a lower portion of the conductive base, and FIG. 5D is a graph showing a relationship between the shape of the lower portion of the conductive base and stress.

As shown in FIG. 5A, a large-sized protrusion 113b is formed at a lower portion, that is, at the third surface 113 of the conductive base 110. When pressure P is upwardly applied to the protrusion 113b from a bottom thereof so as to couple the conductive base 110 to the external device, pressure more than 50,000 [Pa] may be transferred to the semiconductor chip 130. In addition, as shown in FIG. 5B, when a protrusion ring 113a is formed at the third surface 113 of the conductive base 110 and the conductive base 110 is coupled with the external device by upwardly applying pressure to the protrusion ring 113a from a bottom of the protrusion ring 113a, pressure of approximately 30,000 [Pa] may be transferred to the semiconductor chip 130. In the meantime, as shown in FIG. 5C, when the third surface 113 of the conductive base 110 has a planar structure, pressure of approximately 40,000 [Pa] may be transferred to the semiconductor chip 130.

Therefore, if the protrusion ring 113a is provided at the third surface 113 of the conductive base 110, stress transferred to the semiconductor chip may be minimized so that the semiconductor chip can be prevented from being damaged.

Figure 6:
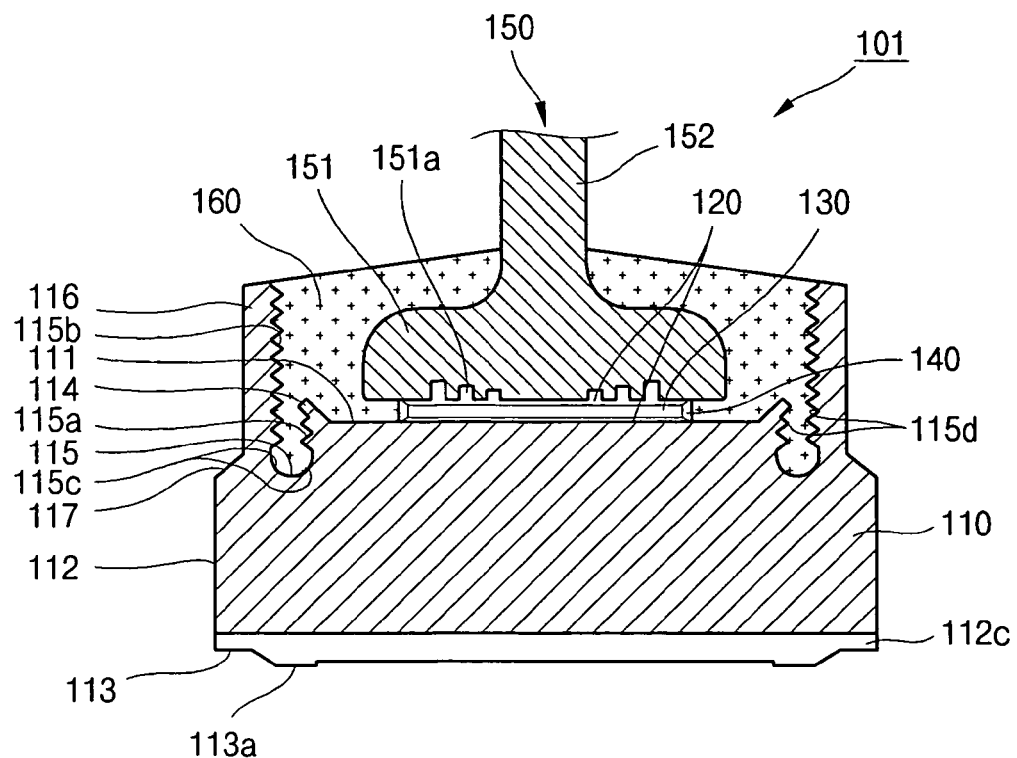
FIG. 6 is a sectional view showing a rectifier diode device according to another embodiment of the present invention.

FIG. 6 is a sectional view showing a rectifier diode device according to another embodiment of the present invention. In the following description, common reference numerals are used to indicate the same elements.

As shown in FIG. 6, a rectifier diode device 101 according to another embodiment of the present invention includes a corrugated section 115d formed at both sidewalls 115a and 115b of the trench 115 formed in the conductive base 110. The corrugated section 115d may increase a contact surface between the insulating resin 160 and the conductive base 110 and lengthen the humidity transfer path for the semiconductor chip 130. Accordingly, bonding force between the insulating resin 160 and the conductive base 110 can be improved and the semiconductor chip 130 has a superior humidity resistance characteristic.

Figure 7:
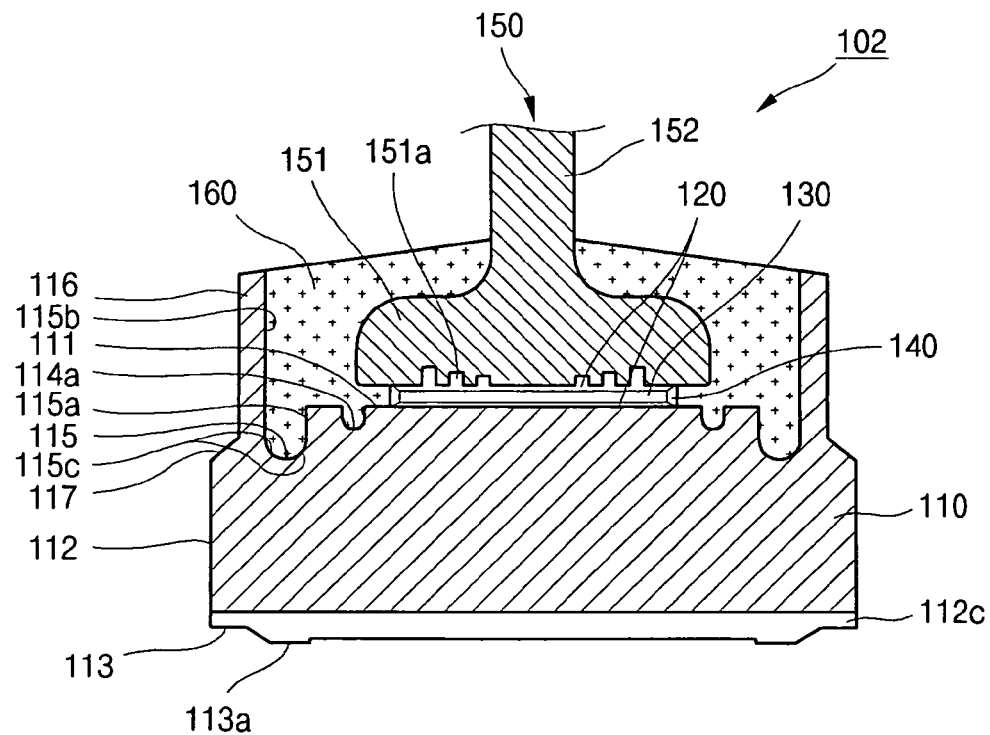
FIG. 7 is a sectional view showing a rectifier diode device according to still another embodiment of the present invention.

FIG. 7 is a sectional view showing a rectifier diode device according to still another embodiment of the present invention.

As shown in FIG. 7, a rectifier diode device 102 of the present embodiment further includes an auxiliary trench 114a having a predetermined depth and formed at an outer peripheral portion of the first surface 111 of the conductive base 110 corresponding to an outer peripheral portion of the semiconductor chip 130. The depth and width of the auxiliary trench 114a are smaller than those of the trench 115. In addition, the first surface 111 has no protrusions at the outer peripheral portion thereof. That is, according to the present embodiment, the auxiliary trench 114a has a role of the protrusions. In other words, the auxiliary trench 114a formed in the conductive base 110 may improve bonding force between the conductive base 110 and the insulating resin 160, instead of the protrusions.

Figure 8:
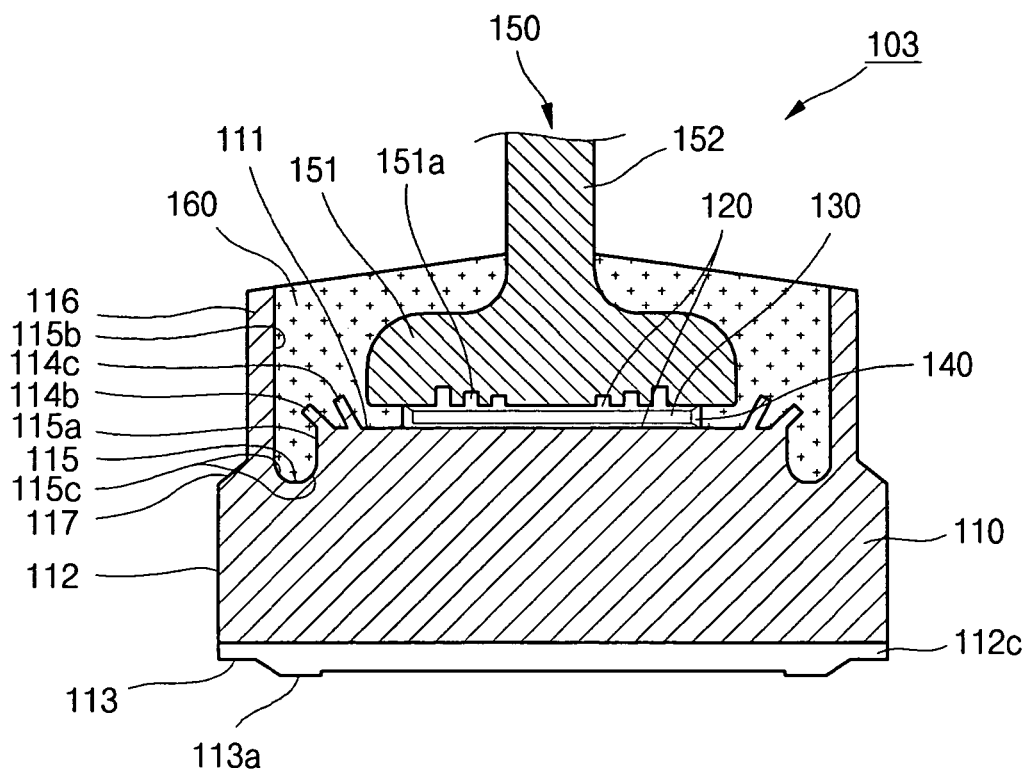
FIG. 8 is a sectional view showing a rectifier diode device according to still another embodiment of the present invention.

FIG. 8 is a sectional view showing a rectifier diode device according to still another embodiment of the present invention.

As shown in FIG. 8, a rectifier diode device 103 of the present embodiment further includes two protrusions 114b and 114c having a predetermined length and formed at an outer peripheral portion of the first surface 111 of the conductive base 110 corresponding to an outer peripheral portion of the semiconductor chip 130. The protrusions 114b and 114c are provided at the vicinity of an edge portion of the first surface 111 of the conductive base 110. Due to the protrusions 114b and 114c, bonding force between the conductive base 110 and the insulating resin 160 can be further improved.

Figure 9:
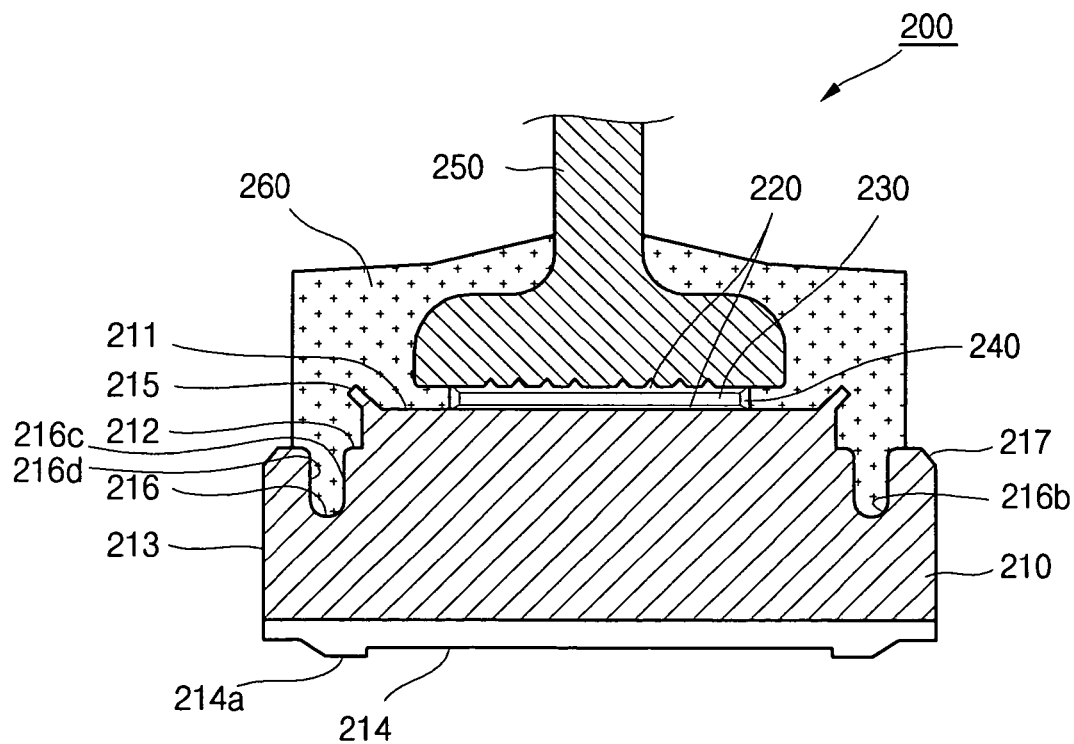
FIG. 9 is a sectional view showing a rectifier diode device according to still another embodiment of the present invention.

FIG. 9 is a sectional view showing a rectifier diode device according to still another embodiment of the present invention. In rectifier diode devices 200, 201, 202, and 203, which will be described in the following description, a conductive lead 240 and a prismatic protrusion structure formed in a third surface 213 of a conductive base 210 are identical to the conductive lead 150 and the prismatic protrusion structure formed in the second surface of the conductive base 110 of the rectifier diode device 100. Thus, they will not be further described below in order to avoid redundancy.

As shown in FIG. 9, the rectifier diode device 200 of the present invention includes the conductive base 210, a semiconductor chip 230 electrically connected to the conductive base 210, the conductive lead 250 electrically connected to the semiconductor chip 230, and insulating resin 260 for encapsulating the conductive base 210, the semiconductor chip 230 and the conductive lead 250.

First, the conductive base 210 is formed in a substantially cylindrical shape. That is, the conductive base 210 is formed with a first surface 210 having a planar structure in order to allow the semiconductor chip 230 to be stably rested on the first surface 210, and a second surface 212 having a substantially planar structure and formed below an outer peripheral portion of the first surface 211. The third surface 213 of the conductive base 210 is formed at an outer portion of the second surface 212 in perpendicular to the second surface 212. In addition, a fourth surface 214 is formed at a bottom of the conductive base 210 in opposition to the first and second surfaces 211 and 212 of the conductive base 210.

Herein, a plurality of protrusion 215 are provided at an outer peripheral portion of the first surface 211 of the conductive base 210 so as to improve coupling-force between the conductive base 210 and the insulating resin 260.

In addition, a trench 216 having a predetermined depth is formed in the second surface 212 of the conductive base 210 so that coupling force between the conductive base 210 and the insulating resin 260 can be further improved while significantly lengthening a humidity transfer path formed at an interfacial surface between the conductive base 210 and the insulating resin 260. Therefore, according to the present invention, humidity cannot reach the semiconductor 230 so that reliability of the rectifier diode device 200 can be improved. Of course, the length of the protrusion 215 is smaller than a width of the trench 216, so the insulating resin 260 is easily filled in the trench 216.

Herein, the trench 216 includes a round section 216b formed at a bottom thereof between an inner wall 216c and an outer wall 216d of the trench 216. Accordingly, when the conductive base 210 is press-fitted into the external device, that is, when a fitting surface 217 of the conductive base 210 is pressed fitted into the external device, the round section 216b effectively absorb and distribute stress applied thereto. Thus, the semiconductor chip 230 can be prevented from being broken.

The fitting surface 217 is an inclined surface formed between the second surface 212 and the third surface 213 of the conductive base 210. Therefore, the rectifier diode device 200 can be easily coupled with the external device. In addition, stress transferred through the fitting surface 217 can be absorbed and reduced by means of the trench 216.

The fourth surface 214 of the conductive base 210 is provided with a protrusion ring 214a having a predetermined thickness. As mentioned above, the protrusion ring 214a may significantly reduce stress transferred to the semiconductor chip 230 when the rectifier diode device 200 is press-fitted into the coupling hole of the external device.

Meanwhile, as mentioned above, the third surface 213 of the conductive base 210 is formed with a plurality of prismatic protrusions, a circumferential surface and an inclined surface. Such a structure of the third surface 213 of the conductive base 210 is identical to the structure of the second surface of the rectifier diode device 100, so it will not be further described below.

The semiconductor chip 230 is connected to the first surface 211 of the conductive base 210 by means of a connection member 220. The connection member 220 includes a solder or the like capable of allowing the semiconductor chip 230 to be electrically connected to the conductive base 210 in an easy manner. However, the present invention does not limit materials for the conductive connection member 220. In addition, an insulation protective film 240 is coated around a lateral portion of the semiconductor chip 230 with a predetermined thickness in order to prevent current-leakage of the semiconductor chip 230.

The conductive lead 250 is connected to an upper surface of the semiconductor chip 230 by means of the conductive connection member 220. The conductive lead 250 has a predetermined length and upwardly protrudes from the insulating resin 260. The conductive connection member 120 may include the solder or the like capable of allowing the semiconductor chip 230 to be electrically connected to the conductive lead 250. The present invention does not limit materials for the conductive connection member 220.

The conductive lead 250 has a bonding surface formed with a plurality of first and second slots. Structures of the first and second slots formed in the bonding surface of the conductive lead 250 are identical to structures of the first and second slots formed in the rectifier diode device 100, so they will not be further described below.

In addition, the insulating resin 260 encapsulates first and second surfaces 211 and 212, the protrusions 215 and the trench 216 of the conductive base 210, which are aligned corresponding to an outer peripheral portion of the semiconductor chip 230, the semiconductor chip 230 and the conductive lead 250. In addition, an upper end of the conductive lead 250 and the third and fourth surfaces 213 and 214 of the conductive base 210 are exposed to an exterior. Thus, the conductive base 210 and the conductive lead 250 can be electrically connected to the external device in an easy manner. In addition, the insulating resin 260 may completely surround the protrusions 215 formed in the conductive base 210 while completely filling the trench 216, thereby further improving coupling force between the insulating resin 260 and the conductive base 210. In addition, the humidity transfer path for the semiconductor chip 240 may be lengthened due to the trench 216 so that the rectifier diode device 200 has a superior humidity resistance characteristic and improved reliability.

Herein, a process for encapsulating the conductive base 210, the semiconductor chip 230 and the conductive lead 250 by using the insulating resin 260 can be performed by means of a mold. That is, after placing the conductive base 210 coupled with the semiconductor chip 230 and the conductive lead 250 in a predetermined mold, high-temperature and high-pressure insulating resin is filled in the mold. Then, the insulating resin is cured in such a manner that the insulating resin may surround the conductive lead 250, the semiconductor chip 230 and the conductive base 210.

After fabricating the rectifier diode device 200 through the above molding process, the conductive base 210 is press-fitted into the external device and the conductive lead 250 is electrically connected to a phase lead of the external device through soldering or welding.

Figure 10:
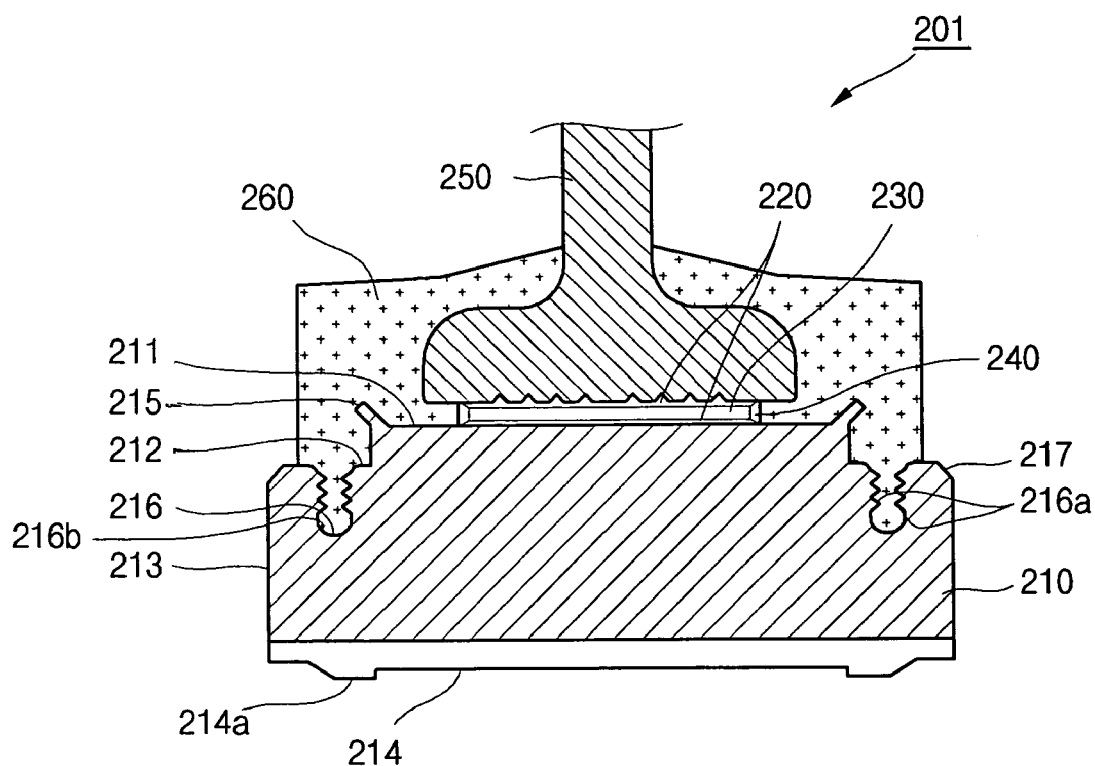
FIG. 10 is a sectional view showing a rectifier diode device according to still another embodiment of the present invention.

FIG. 10 is a sectional view showing a rectifier diode device according to still another embodiment of the present invention. In the following description, common reference numerals are used to indicate the same elements.

As shown in FIG. 10, a rectifier diode device 201 according to the present embodiment further includes a corrugated section 216a formed at both sidewalls of the trench 216 formed in the conductive base 210. The corrugated section 216a may increase a contact surface between the insulating resin 260 and the conductive base 210 and lengthen the humidity transfer path for the semiconductor chip 230. Accordingly, bonding force between the insulating resin 260 and the conductive base 210 can be improved and the semiconductor chip 230 has a superior humidity resistance characteristic.

Figure 11:
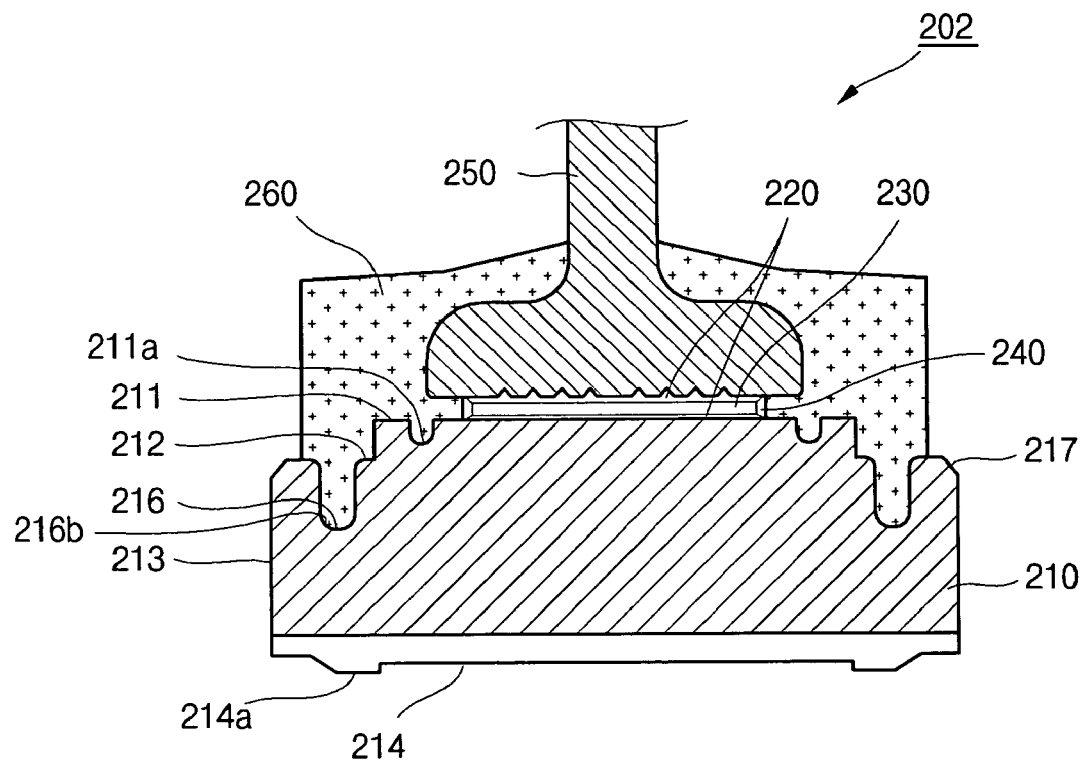
FIG. 11 is a sectional view showing a rectifier diode device according to still another embodiment of the present invention.

FIG. 11 is a sectional view showing a rectifier diode device according to still another embodiment of the present invention.

As shown in FIG. 11, a rectifier diode device 202 of the present embodiment further includes an auxiliary trench 211a having a predetermined depth and formed at an outer peripheral portion of the first surface 211 of the conductive base 210 corresponding to an outer peripheral portion of the semiconductor chip 230. The depth and width of the auxiliary trench 114a are smaller than those of the trench 216. In addition, the first surface 211 has no protrusions at the outer peripheral portion thereof. That is, according to the present embodiment, the auxiliary trench 211a has a role of the protrusions. In other words, the auxiliary trench 211a formed in the conductive base 210 may improve bonding force between the conductive base 210 and the insulating resin 260, instead of the protrusions.

Figure 12:
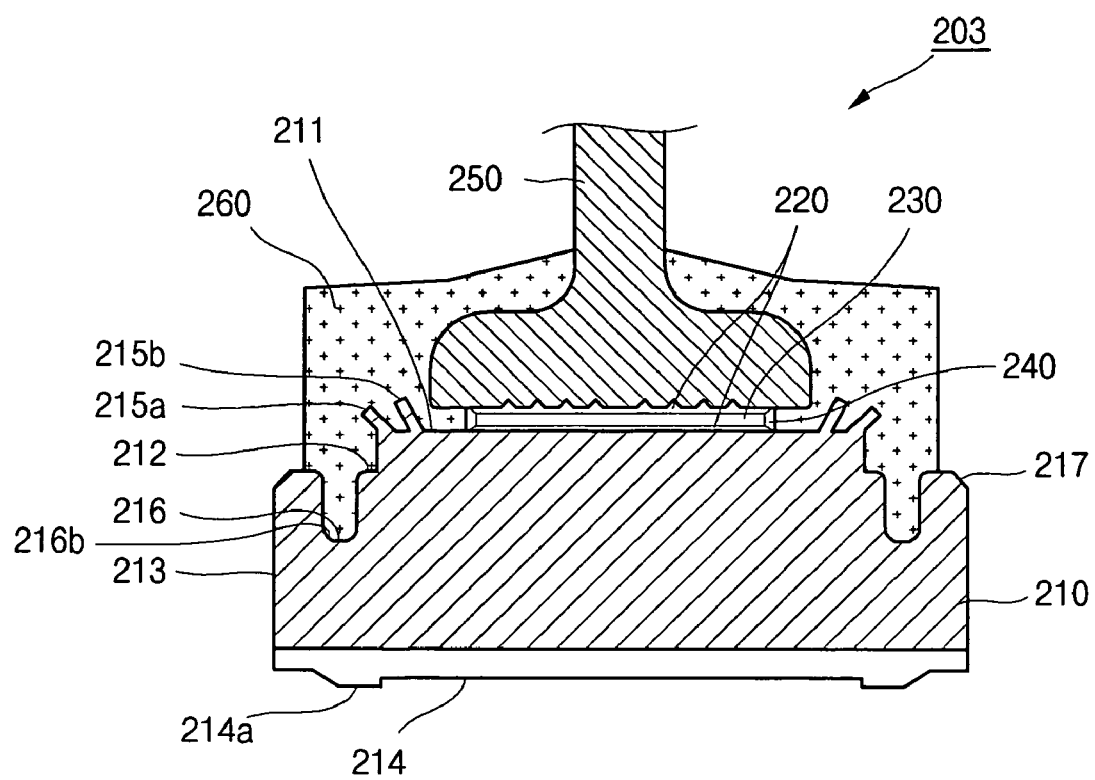
FIG. 12 is a sectional view showing a rectifier diode device according to still another embodiment of the present invention.

FIG. 12 is a sectional view showing a rectifier diode device according to still another embodiment of the present invention.

As shown in FIG. 12, a rectifier diode device 203 of the present embodiment further includes two protrusions 215a and 215b having a predetermined length and formed at an outer peripheral portion of the first surface 211 of the conductive base 210 corresponding to an outer peripheral portion of the semiconductor chip 230. The protrusions 215a and 215b are provided at the vicinity of an edge portion of the first surface 211 of the conductive base 210. Due to the protrusions 215a and 215b, bonding force between the conductive base 210 and the insulating resin 260 can be further improved.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A rectifier diode device comprising:
   a conductive base including a first surface having a substantially planar structure, a trench having a predetermined depth and a predetermined width and formed below an outer peripheral portion of the first surface, a post formed unitarily and extending from an outer peripheral portion of the trench and having a predetermined height, the height of the post being larger than the width of the trench by 3.0 to 3.4 times, a second surface formed at an outer peripheral portion of the post in vertical relation to the first surface, and a third surface formed at a lower portion of the second surface in opposition to the first surface;
   a semiconductor chip connected to the first surface of the conductive base via a first connection member;
   a conductive lead connected to an upper surface of the semiconductor chip via a second connection member, the conductive lead having at least one slot formed at a lower surface of the conductive lead; and
   insulating resin for encapsulating the first surface of the conductive base between an outer portion of the semiconductor chip and the outer peripheral portion of the first surface, the trench, the outer portion of semiconductor chip and the conductive lead while exposing an upper portion of the conductive lead and the second and third surfaces of the conductive base to an exterior.

2. The rectifier diode device as claimed in claim 1, wherein a plurality of prismatic protrusions including valley sections and mountain sections are formed on the second surface of the conductive base, a circumferential surface having a diameter corresponding to an outer diameter of the prismatic protrusions defined by the mountain sections is formed at a lower end of the second surface, and an inclined surface having a substantially triangular shape is formed between the valley sections and the circumferential surface.

3. The rectifier diode device as claimed in claim 1, wherein a protrusion ring is formed at the third surface of the conductive base with a predetermined thickness.

4. The rectifier diode device as claimed in claim 1, wherein the height of the post is about 3.8±0.2 mm and the width of the trench is about 1.178±0.05 mm.

5. The rectifier diode device as claimed in claim 1, wherein a fitting surface, which is downwardly inclined in an outward direction, is formed between the post and the second surface of the conductive base, and a lower end of the fitting surface is aligned in line with a bottom of the trench.

6. The rectifier diode device as claimed in claim 1, further comprising at least one protrusion provided adjacent at an edge portion formed between the first surface of the conductive base and the trench, and upwardly inclined in an outward direction.

7. The rectifier diode device as claimed in claim 1, wherein the at least one slot of the conductive lead includes at least one first slot concentrically aligned at the lower surface of the conductive lead with different diameters, and a plurality of second slots formed at the lower surface of the conductive lead in a radially outward direction of the conductive lead.

8. The rectifier diode device as claimed in claim 7, wherein depths of the first and second slots are gradually increased from a center to an outer peripheral portion of the conductive lead and the lower surface of the conductive lead is connected to the semiconductor chip with a solder.

9. The rectifier diode device as claimed in claim 1, further comprising a round section formed at a bottom of the trench between an inner sidewall and an outer sidewall of the trench.

10. The rectifier diode device as claimed in claim 1, further comprising a corrugated section formed at an inner sidewall and an outer sidewall of the trench.

11. The rectifier diode device as claimed in claim 1, further comprising an auxiliary trench having a depth smaller than the depth of the trench and formed at the first surface of the conductive base corresponding to an outer peripheral portion of the semiconductor chip.

12. A rectifier diode device comprising:
   a conductive base including a first surface having a substantially planar structure, a second surface formed at a lower portion of an outer peripheral portion of the first surface in parallel relation to the first surface, a trench formed in the second surface with a predetermined depth, a third surface formed at a lower portion of an outer peripheral portion of the second surface in vertical relation to the second surface, and a fourth surface formed at a lower portion of the third surface in opposition to the first and second surfaces;
   a semiconductor chip connected to the first surface of the conductive base via a first connection member;
   a conductive lead connected to an upper surface of the semiconductor chip via a second connection member; and
   insulating resin for encapsulating the first surface, the second surface, and the trench of the conductive base, which are aligned corresponding to an outer peripheral portion of the semiconductor chip, the semiconductor chip and the conductive lead while exposing an upper end of the conductive lead and the third and fourth surfaces of the conductive base to an exterior.

13. The rectifier diode device as claimed in claim 12, wherein a plurality of prismatic protrusions including valley sections and mountain sections are formed on the third surface of the conductive base, a circumferential surface having a diameter corresponding to an outer diameter of the prismatic protrusions defined by the mountain sections is formed at a lower end of the third surface, and an inclined surface having a substantially triangular shape is formed between the valley sections and the circumferential surface.

14. The rectifier diode device as claimed in claim 12, wherein a protrusion ring is formed at the fourth surface of the conductive base with a predetermined thickness.

15. The rectifier diode device as claimed in claim 12, wherein a fitting surface, which is downwardly inclined in an outward direction, is formed between the second surface and the third surface of the conductive base.

16. The rectifier diode device as claimed in claim 12, further comprising at least one protrusion provided in a vicinity of the first surface of the conductive base, and upwardly inclined in an outward direction.

17. The rectifier diode device as claimed in claim 12, wherein at least one first slot is concentrically aligned at a lower surface of the conductive lead with different diameters, and a plurality of second slots is formed at the lower surface of the conductive lead in a radially outward direction of the conductive lead.

18. The rectifier diode device as claimed in claim 17, wherein depths of the first and second slots are gradually increased from a center to an outer peripheral portion of the conductive lead and the lower surface of the conductive lead is connected to the semiconductor chip with a solder.

19. The rectifier diode device as claimed in claim 12, further comprising a round section formed at a bottom of the trench between an inner sidewall and an outer sidewall of the trench.

20. The rectifier diode device as claimed in claim 12, further comprising a corrugated section formed at an inner sidewall and an outer sidewall of the trench.

21. The rectifier diode device as claimed in claim 12, further comprising an auxiliary trench having a depth smaller than the depth of the trench and formed at the first surface of the conductive base corresponding to an outer peripheral portion of the semiconductor chip.

* * * * *